United States Patent [19]

Lebby et al.

[11] Patent Number: 5,358,880
[45] Date of Patent: Oct. 25, 1994

[54] METHOD OF MANUFACTURING CLOSED CAVITY LED

[75] Inventors: Michael S. Lebby, Apache Junction; Chan-Long Shieh, Paradise Valley; Craig A. Gaw, Scottsdale, all of Ariz.

[73] Assignee: Motorola, Inc., Schaumburg, Ill.

[21] Appl. No.: 44,787

[22] Filed: Apr. 12, 1993

[51] Int. Cl.$^5$ ............................................. H01L 21/265
[52] U.S. Cl. ...................................... 437/23; 437/105; 437/107; 437/126; 437/127; 437/129; 437/133; 372/45
[58] Field of Search ................... 437/23, 105, 107, 127, 437/126, 129, 133; 372/45

[56] References Cited

U.S. PATENT DOCUMENTS 3,959,045  5/1976  Antypas ............................ 156/600
4,602,370  7/1986  Tsang ............................... 372/45
4,949,350  8/1990  Jewell et al. ..................... 372/45
5,034,092  7/1991  Lebby et al. ...................... 156/643

Primary Examiner—R. Bruce Breneman
Assistant Examiner—Ramamohan Rao Paladugu
Attorney, Agent, or Firm—Eugene A. Parsons

[57] ABSTRACT

A method of manufacturing a closed cavity LED including forming, on a substrate, a short cavity LED with electrically conductive layers on opposite ends. Depositing a transparent conductive layer of material over one electrically conductive layer and affixing glass or a diamond film over the transparent conductive layer to define and protect a light output area. Removing the substrate and covering the top and sides of the cavity with dielectric material and contact metal. The metal being in contact with the transparent conductive layer and the other electrical contact layer. Thus, a reflector covers the cavity in all directions except the light output area to increase external efficiency.

21 Claims, 1 Drawing Sheet

METHOD OF MANUFACTURING CLOSED CAVITY LED

FIELD OF THE INVENTION

The present invention pertains to light emitting diodes (LED) and more specifically to an LED with improved light emission and efficiency.

BACKGROUND OF THE INVENTION

The efficiency of a LED is limited by the total internal reflection because the index of refraction of the semiconductor material making up the LED (typically 3–3.5) is much higher than the index of refraction of the air (1) into which the light is emitted. Light distribution within a LED is generally referred to as Lambertian distribution, or omnidirectional distribution. Because of this large spatial distribution of the generated light, only small amounts of the light can be effectively utilized, especially if the light is going to be coupled to a light conduction medium such as an optical fiber. In dealing with a Lambertian source, such as a LED, there are many ways available today to provide a method to increase the light coupling from the LED to the fiber core. For example, spherical lenses, microlenses, gradient index lenses (GRIN), diffraction gratings all are utilized successfully. Unfortunately, none of these techniques actually increases the amount of light generated for the same input current.

Increased efficiency implies less current and, therefore, less power to couple the same amount of light to a system. A more efficient LED provides higher optical coupling and less stringent specifications on the coupling designs and procedures, which results in less expensive and more manufacturable systems. These reasons imply that if the efficiency of a LED can be increased then the device will become more useful in applied technology.

One method to improve the external efficiency of an LED is to utilize mirror stacks on opposite sides of an active area to provide multiple reflections of the photons inside the LED cavity. This technique has been successfully applied to vertical cavity surface emitting lasers (VCSEL) where two mirror stacks are reflective enough to generate stimulated emission. The design of such mirror stacks can be engineered to produce a superluminescent LED, as disclosed in a co-pending U.S. patent application entitled "Superluminescent Surface Light Emitting Device", filed Oct. 4, 1991, bearing Ser. No. 07/770,841 and assigned to the same assignee.

A major difference between superluminescent LEDs and standard LEDs is the fact that the spatial distribution of light output is much narrower and allows for higher efficiency optical coupling to fibers, waveguides, etc. In VCSELs the spatial distribution of light is extremely narrow. Currently, LEDs require large drive currents to generate enough light so that a reasonable amount of light couples to an optical fiber. With improved efficiencies, less current is required and, therefore, less heat is generated. Thus, a LED with improved efficiency results in greater applicability of the LED for commercial use.

SUMMARY OF THE INVENTION

It is a purpose of the present invention to provide a closed cavity LED with improved light emitting characteristics and improved efficiency.

It is a further object of the present invention to provide a method of manufacturing a closed cavity LED.

The above problems and others are solved and the above purposes and others are realized in a method of manufacturing closed cavity LEDs including the steps of providing a first substrate having a major surface and depositing a plurality of layers of material on the major surface of the first substrate to form an LED. The plurality of layers are deposited with two electrically conductive layers, a first conductive layer of the two electrically conductive layers being formed in overlying relationship adjacent the major surface of the first substrate and on one side of the plurality of layers and a second conductive layer of the two electrically conductive layers being formed on an opposite side of the plurality of layers. The second conductive layer further defines a light emitting area. A substantially light transparent, electrically conductive layer of material is then deposited on the second conductive layer in overlying relationship to the light emitting area and in electrical contact with the second conductive layer. A protective optically transparent substrate is fixed in overlying relationship to the transparent conductive layer. The first substrate is removed, thereby exposing the first conductive layer. Portions of the plurality of layers of material are removed to define and expose sides of the LED. A layer of dielectric material is deposited on the exposed sides of the LED and in overlying relationship on exposed portions of the first conductive layer and the transparent conductive layer. First and second contact areas are opened through the layer of dielectric material to the first conductive layer and to the transparent conductive layer of material, respectively, and a layer of electrical contact material is deposited over the layer of dielectric material and in the open first and second contact areas in contact with the first conductive layer and the transparent conductive layer of material to form first and second external electrical contacts of the LED and to form a reflector on all sides of the LED, except the light emitting area.

The above problems and others are solved and the above purposes and others are realized in a closed cavity LED including a plurality of layers of material with a first conductive layer of a first conductivity type, a first cladding layer of the first conductivity type positioned on the first conductive layer, an active layer positioned on the first cladding layer, a second cladding layer of a second conductivity type positioned on the active layer, and a second conductive layer of the second conductivity type positioned on the second cladding layer, the plurality of layers of material defining sides of an LED, and the second conductive layer further defining a light emitting area, a substantially light transparent, electrically conductive layer of material positioned on the second conductive layer in overlying relationship to the light emitting area and in electrical contact with the second conductive layer, a protective optically transparent substrate positioned in overlying relationship to the transparent conductive layer, a layer of dielectric material positioned on the sides of the LED and in overlying relationship on exposed portions of the first conductive layer and the transparent conductive layer, first and second contact areas extending through the layer of dielectric material to the first conductive layer and to the transparent conductive layer of material, respectively, and a layer of electrical contact material positioned over the layer of dielectric material and in the open first and second contact areas in contact with the first conductive layer and the transparent conductive layer of material to form first and second external electrical contacts of the LED and to form a reflector on all sides of the LED, except the light emitting area.

BRIEF DESCRIPTION OF THE DRAWINGS

Referring to the drawings, wherein like characters indicate like parts throughout the figures.

DESCRIPTION OF THE PREFERRED EMBODIMENT

Figure 1:
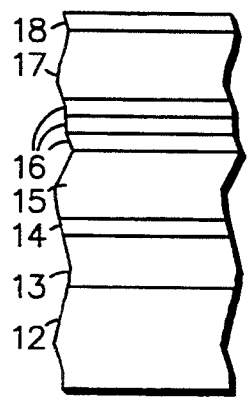
FIGS. 1-6 illustrate various stages of development of a closed cavity LED in accordance with the present invention.

Referring to the figures and specifically to FIG. 1, initial steps in the formation of a closed cavity LED 10 in accordance with the present invention are illustrated. A substrate 12 of a suitable material for forming the various layers comprising LED 10 is provided. Generally, the various layers are formed by epitaxial deposition accomplished by well known techniques in the art such as MBE, MOCVD, CBE, or the like. These techniques enable epitaxial depositions of relatively thin and thick layers of materials such as gallium arsenide, aluminum gallium arsenide, aluminum arsenide, silicon, indium gallium arsenide, etc.

A layer 13 is deposited on the upper surface of substrate 12 for use as an etch stop layer, as will be explained in more detail presently. An electrically conductive layer 14, which is heavily doped with an impurity to produce the first conductivity type, is deposited over layer 13. As will be understood presently, layer 14 is heavily doped to provide a good electrical connection between external electrical contacts and the light generating portion of LED 10.

A layer 15 is deposited over layer 14 and forms a cladding region of the first conductivity type in LED 10. Layer 15 is lightly doped with an impurity to produce the first conductivity type. Three layers 16 of undoped material cooperate to provide an active region of LED 10. A second cladding layer 17 is deposited on the upper surface of the active region and is lightly doped with an impurity to produce a second conductivity type. Layers 16 forming the active region and cladding layers 15 and 17 on either side thereof form the light generating portion of LED 10. Layers 15, 16 and 17 form what is commonly referred to as the cavity of the LED and is the light generating portion of LED 10. In the present embodiment of LED 10 the cavity is made very short so that the internal free carrier loss is small, thereby increasing the efficiency.

A second electrically conductive layer 18 is deposited over the upper surface of layer 17. Layer 18 is heavily doped with an impurity that produces a second conductivity type to provide a good electrical connection between external electrical contacts and the light generating portion of LED 10.

In a specific example of the structure illustrated in FIG. 1, substrate 12 is formed of gallium arsenide (GaAs). Layer 13 is formed of aluminum gallium arsenide (AlGaAs), with 60% aluminum, and is deposited approximately 0.5 micrometers thick, but can be as thin as 200 angstroms. Layer 14 is formed of gallium arsenide (GaAs), with 100% gallium, and is doped with a P-type dopant to provide P+type GaAs. Layer 14 is deposited approximately 0.05 micrometers thick and is doped with a dopant concentration of $2 \times 10^{19}$ cm$^{-3}$.

Layer 15 is formed of aluminum gallium arsenide (AlGaAs), with 30% aluminum, and is doped with P-type dopant to provide P-type aluminum gallium arsenide. Layer 15 is deposited approximately 0.5 micrometers thick and is doped with a dopant concentration of $3 \times 10^{17}$ cm$^{-3}$. For the three layers 16 which form the active region, the two outside layers are formed of undoped gallium arsenide (GaAs) deposited approximately 100 angstroms thick and the central layer is formed of undoped indium gallium arsenide (InGaAs) deposited approximately 100 angstroms thick and with an indium content nominally 20%. The wavelength of radiated light is greater than 920 nanometers (long enough not to get absorbed in GaAs) and, in this embodiment, is approximately 960 nanometers. Layer 17, which forms the second cladding layer, is formed with a thickness and doping content similar to layer 15, except that it is doped with N-type dopant, such as silicon. Layer 18, which is the second electrically conductive layer, is formed by depositing gallium arsenide (GaAs), with 100% gallium, to a thickness of approximately 0.05 micrometers and doping it with N-type dopant at a concentration of $5 \times 10^{18}$ cm$^{-3}$.

Figure 2:
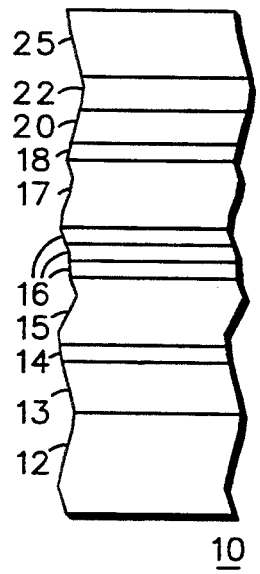

Referring to FIG. 2, a layer 20 of substantially light transparent, electrically conductive material is deposited over and in electrical contact with layer 18. Generally, layer 20 is formed of the well known indium-tin-oxide (ITO) material which is a transparent conductive material but it should be understood that any other material, such as cadmium-tin-oxide (CTO), which is a transparent conductive material could be utilized. A protective optically transparent substrate 25 is fixed over layer 20 and, as will be explained presently, forms the light output area of LED 10. Protective optically transparent substrate 25 is formed of a relatively hard substance, such as glass, sapphire, diamond, etc. and is fixed in place by means of an adhesive layer 22, such as epoxy. Because output light is transmitted through layer 20 and substrate 25, adhesive layer 22 should also be substantially optically transparent and can be, for example, any of the clear curing epoxies available commercially. It should be understood that the term "fixing", when used in conjunction with protective optically transparent substrate, is intended to include any growing, depositing, attaching steps and the term "protective optically transparent substrate" includes the result of such steps. For example, instead of glass substrate 25 could be an optically transparent film of diamond or carbon-like diamond deposited in a manner similar to that described in U.S. Pat. No. 5,128,006, entitled "Deposition of Diamond Films on Semiconductor Substrates", issued Jul. 7, 1992.

Figure 3:
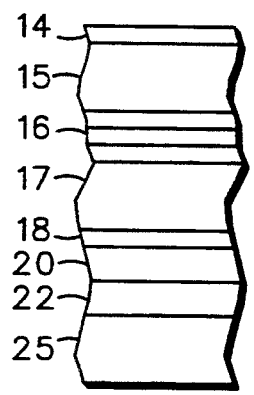

Referring to FIG. 3, the structure of FIG. 2 is illustrated in an inverted position. Further, substrate 12 has been removed. Generally, the simplest procedure for removing substrate 12 is to simply etch it away. Thus, in this specific embodiment etch stop layer 13 has been provided. In this embodiment a wet etch, including for example NH$_4$OH:H$_2$O$_2$, is utilized to remove GaAs substrate 12. It will be understood, that substrate 12 could be removed by using dry plasma etching and hot chlorine chemistry, as well as many other known etches. In the structure illustrated in FIG. 3, layer 13 has also been removed and, again, this can simply be performed by etching. The same etch will not operate well on layer 13, but an etchant, such as HF or the like, can be utilized. It will of course be understood that etch stop layer 13 is an optional layer included only for convenience and, assuming that an operator has good control of the etching process (or other removal process), is not a requirement to the removal of layer 12.

Figure 4:
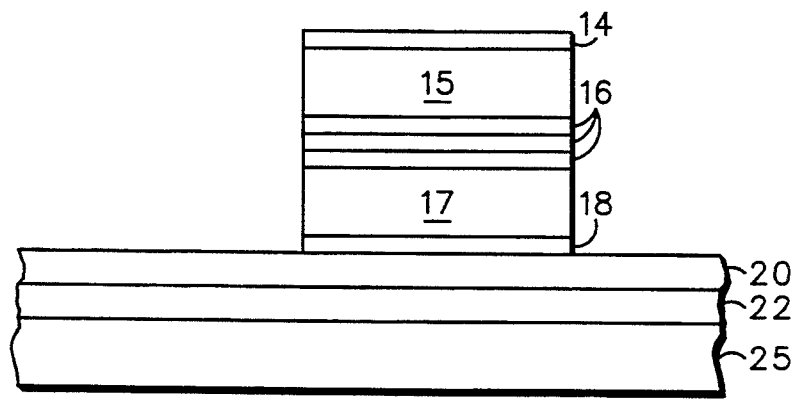

The structure of FIG. 3 is illustrated in FIG. 4 with the additional process step of removing portions of the plurality of layers (layers 14, 15, 16, 17 and 18) to define LED 10 and expose the sides thereof. Generally, this removal process is again performed by etching and in this instance layer 20 provides a suitable etch stop layer. As illustrated in FIG. 4, layers 15, 16 and 17 form the cavity of LED 10 and layers 14 and 18 are electrically conductive layers positioned to electrically contact the cavity and introduce appropriate electrical current thereto.

Figure 5:
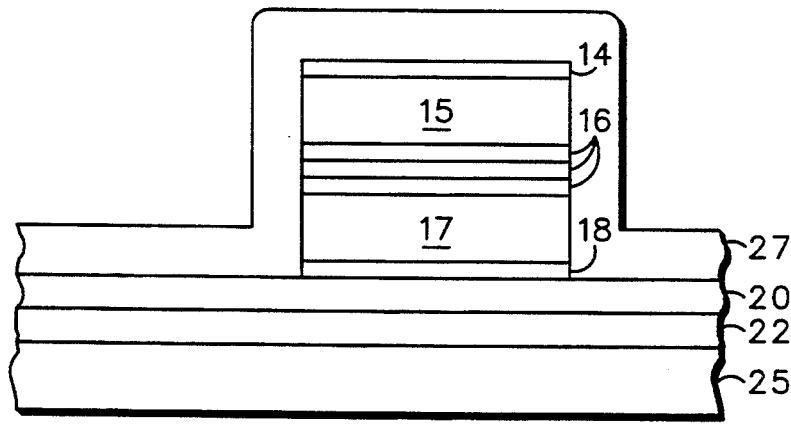

The structure of FIG. 4 is illustrated in FIG. 5 with an additional process step of depositing a dielectric layer 27 over the surface of the structure. In this embodiment a layer of silicon nitride (SiN) is deposited but any convenient dielectric can be utilized.

After the deposition of layer 27, vias, or contact areas, are opened through layer 27 to expose surface areas of layers 14 and 20. Generally, the contact areas are opened by masking and etching layer 27 in a well known manner. With surface areas of layers 14 and 20 exposed, electrical contact material is deposited to form external electrical contacts 30 and 32. Contact 30 is electrically connected to one side of the cavity of LED 10 through conductive layer 14 and contact 32 is electrically connected to the other side of the cavity of LED 10 through conductive layers 20 and 18. In the specific embodiment disclosed both contacts 30 and 32 are formed of P-type metals, however it will be understood that one or both of contacts 30 and 32 could be formed of N-type metals in specific applications. Some specific examples of P-type metals include TiW or Au/Pt/Ti and of N-type metals include Ni/Ge/Au or Ni/Ge/W. Many other contact metals are known to those skilled in the art.

Figure 6:
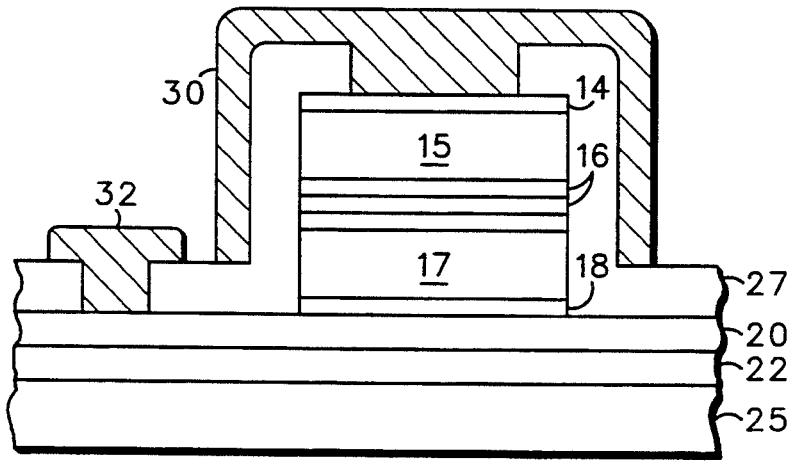

In the specific embodiment described, the electrical contact material forming contact 30 is deposited over the entire top and sides of LED 10 (on the outside of dielectric layer 27) and forms a reflective layer to reflect light (photons) in all directions, within the LED, except the direction where light emerges from LED 10, i.e. through layers 20, 22 and 25 (downwardly in FIG. 6). While the electrical contact material is utilized in this embodiment as a reflective layer, it will be understood that other materials might also be utilized, if desired, or for specific applications. Because the omnidirectionally generated light is only allowed to emerge from LED 10 through layers 20, 22 and 25, the external efficiency of the LED is greatly improved. Further, as explained above, the cavity of LED 10 is made very short so that the internal free carrier loss is small. Thus, closed cavity LEDs with improved light emitting characteristics and improved efficiency are disclosed. Further, methods of manufacturing closed cavity LEDs are disclosed which greatly simplify the operation.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of manufacturing closed cavity LEDs comprising the steps of:
   providing a first substrate having a major surface;
   depositing a plurality of layers of material on the major surface of the first substrate to form an LED, the plurality of layers being deposited with two electrically conductive layers, a first conductive layer of the two electrically conductive layers being formed in overlying relationship adjacent the major surface of the first substrate and on one side of the plurality of layers and a second conductive layer of the two electrically conductive layers being formed on an opposite side of the plurality of layers, the second conductive layer further defining a light emitting area;
   depositing a light transparent, electrically conductive layer of material on the second conductive layer in overlying relationship to the light emitting area and in electrical contact with the second conductive layer;
   fixing a protective optically transparent substrate in overlying relationship to the transparent conductive layer;
   removing the first substrate and exposing the first conductive layer;
   removing portions of the plurality of layers of material whereby sides of the LED are defined;
   depositing a layer of dielectric material on the sides of the LED and in overlying relationship on exposed portions of the first conductive layer and the transparent conductive layer;
   opening first and second contact areas through the layer of dielectric material to the first conductive layer and to the transparent conductive layer of material, respectively; and
   depositing a layer of electrical contact material over the layer of dielectric material and in the open first and second contact areas in contact with the first conductive layer and the transparent conductive layer of material to form first and second external electrical contacts of the LED and to form a reflector on all sides of the LED, except the light emitting area.

2. A method of manufacturing closed cavity LEDs as claimed in claim 1 wherein the step of depositing a plurality of layers of material includes depositing the first conductive layer of a first conductivity type, depositing a cladding layer of the first conductivity type, depositing an active layer, depositing a second cladding layer of a second conductivity type, and depositing the second conductive layer of the second conductivity type.

3. A method of manufacturing closed cavity LEDs as claimed in claim 1 wherein the step of depositing a first electrically conductive layer of material which is transparent to light includes depositing a layer of indium-tin-oxide.

4. A method of manufacturing closed cavity LEDs as claimed in claim 1 wherein the step of fixing a protective optically transparent substrate in overlying relationship to the transparent conductive layer includes fixing a layer of glass in overlying relationship to the transparent conductive layer.

5. A method of manufacturing closed cavity LEDs as claimed in claim 4 wherein the step of fixing glass in overlying relationship to the transparent conductive layer includes the steps of providing a suitable layer of glass and affixing the layer of glass to the transparent conductive layer.

6. A method of manufacturing closed cavity LEDs as claimed in claim 5 wherein the step of affixing the layer of glass to the transparent conductive layer includes utilizing a layer of epoxy to affix the layer of glass, the layer of epoxy being transparent to light.

7. A method of manufacturing closed cavity LEDs as claimed in claim 1 wherein the step of fixing a protective optically transparent substrate in overlying relationship to the transparent conductive layer includes depositing a film of diamond on the transparent conductive layer.

8. A method of manufacturing closed cavity LEDs as claimed in claim 1 wherein the step of removing portions of the plurality of layers of material includes masking the plurality of layers of material and etching the plurality of layers of material.

9. A method of manufacturing closed cavity LEDs as claimed in claim 8 wherein the step of etching the plurality of layers of material includes utilizing the transparent conductive layer as an etch stop and etching through the plurality of layers of material to the etch stop layer.

10. A method of manufacturing closed cavity LEDs as claimed in claim 1 wherein the step of depositing a layer of dielectric material includes depositing a layer of silicon nitride over the structure.

11. A method of manufacturing closed cavity LEDs as claimed in claim 1 wherein the step of removing the first substrate includes etching the first substrate.

12. A method of manufacturing closed cavity LEDs as claimed in claim 11 wherein the step of etching the substrate includes using a wet etch including $NH_4OH$:$H_2O_2$.

13. A method of manufacturing closed cavity LEDs as claimed in claim 11 wherein the step of etching the substrate includes using a dry plasma etch and hot chlorine chemistry.

14. A method of manufacturing closed cavity LEDs as claimed in claim 11 including in addition the step of depositing an etch stop layer on the substrate prior to the step of depositing the plurality of layers and in underlying relationship to the plurality of layers.

15. A method of manufacturing closed cavity LEDs as claimed in claim 14 including the step of removing the etch stop layer subsequent to removing the first substrate.

16. A method of manufacturing closed cavity LEDs comprising the steps of:
providing a first substrate having a major surface;
depositing a plurality of layers of material to form an LED including depositing a first conductive layer of a first conductivity type on the major surface of the first substrate, depositing a first cladding layer of the first conductivity type on the first conductive layer, depositing an active layer on the first cladding layer, depositing a second cladding layer of a second conductivity type on the active layer, and depositing a second conductive layer of the second conductivity type on the second cladding layer, the second conductive layer further defining a light emitting area;
depositing a light transparent, electrically conductive layer of material on the second conductive layer in overlying relationship to the light emitting area and in electrical contact with the second conductive layer;
fixing a protective optically transparent substrate in overlying relationship to the transparent conductive layer;
removing the first substrate and exposing the first conductive layer;
etching portions of the plurality of layers of material whereby sides of the LED are defined;
depositing a layer of dielectric material on the sides of the LED and in overlying relationship on exposed portions of the first conductive layer and the transparent conductive layer;
opening first and second contact areas through the layer of dielectric material to the first conductive layer and to the transparent conductive layer of material, respectively; and
depositing a layer of electrical contact material over the layer of dielectric material and in the open first and second contact areas in contact with the first conductive layer and the transparent conductive layer of material to form first and second external electrical contacts of the LED and to form a reflector on all sides of the LED, except the light emitting area.

17. A method of manufacturing closed cavity LEDs as claimed in claim 16 wherein the step of etching portions of the plurality of layers of material includes utilizing the transparent conductive layer as an etch stop and etching through the plurality of layers of material to the etch stop layer.

18. A method of manufacturing closed cavity LEDs as claimed in claim 16 wherein the step of fixing a protective optically transparent substrate in overlying relationship to the transparent conductive layer includes fixing a layer of glass in overlying relationship to the transparent conductive layer.

19. A method of manufacturing closed cavity LEDs as claimed in claim 18 wherein the step of fixing glass in overlying relationship to the transparent conductive layer includes the steps of providing a suitable layer of glass and affixing the layer of glass to the transparent conductive layer.

20. A method of manufacturing closed cavity LEDs as claimed in claim 19 wherein the step of affixing the layer of glass to the transparent conductive layer includes utilizing a layer of epoxy to affix the layer of glass, the layer of epoxy being substantially transparent to light.

21. A method of manufacturing closed cavity LEDs as claimed in claim 16 wherein the step of fixing a protective optically transparent substrate in overlying relationship to the transparent conductive layer includes depositing a film of diamond over the transparent conductive layer.

* * * * *